United States Patent [19]

Liebl

[11] 4,255,661
[45] Mar. 10, 1981

[54] ELECTROSTATIC EMISSION LENS

[75] Inventor: Helmut Liebl, Eching, Fed. Rep. of Germany

[73] Assignee: Max-Planck-Gesellschaft zur Forderung der Wissenschaften e.V., Goettingen, Fed. Rep. of Germany

[21] Appl. No.: 60,046

[22] Filed: Jul. 24, 1979

[30] Foreign Application Priority Data

Sep. 29, 1978 [DE] Fed. Rep. of Germany ....... 2842527

[51] Int. Cl.$^3$ .................. G21K 1/08; G21N 23/00; H01J 39/00

[52] U.S. Cl. ..................... 250/396 R; 250/305; 250/310

[58] Field of Search ............... 250/396 ML, 305, 306, 250/309, 310, 396 R

[56] References Cited

U.S. PATENT DOCUMENTS

| 3,582,649 | 6/1971 | Taylor | 250/305 |
|---|---|---|---|
| 3,760,180 | 9/1973 | Weber | 250/305 |
| 4,179,604 | 12/1979 | Christou | 250/310 |

Primary Examiner—Harold A. Dixon

[57] ABSTRACT

An electrostatic emission lens arrangement for producing a microparticle image of a surface by means of charged particles emitted from such surface and accelerated to a predetermined final energy level. Such arrangement includes two apertured diaphragms arranged in spaced relationship to each other and to the emitting surface, and a voltage biasing source for producing a potential difference between the surface and the adjacent first apertured diaphragm electrode, and a potential difference between the first apertured diaphragm electrode and the second apertured diaphragm electrode. According to the invention the spacing distance between the emitting surface and first apertured diaphragm electrode and the spacing distance between the two apertured diaphragm electrodes and, the relationship between the potentials of the surface and of the electrodes are so dimensioned that the charged particles are accelerated between the emitting surface and the first apertured diaphragm electrodes to a multiple of the desired final energy level, and that the particles are retarded to the desired final energy level in passing between the two apertured diaphragm electrodes.

10 Claims, 2 Drawing Figures

ELECTROSTATIC EMISSION LENS

FIELD OF THE INVENTION

The present invention relates to an electrostatic emission lens.

BACKGROUND OF THE INVENTION

G. Mollenstedt and F. Lenz: "Electron Emission Microscopy" published in Advances in Electronics and Electron Physics, No. 18 (1963), pp 251-329;

L. Wegmann: "Auf dem Weg zum Metall-Electronenmikroskop", published in Prakt, Metallographie, No. 5 (1968), pp 241-263;

G. H. Morrison and G. Slodzian: "Ion Microscopy", published in Anal. Chem., No. 47 (1975), pp. 932A-943A.

Electrically conductive surfaces which emit charged particles can, by means of these particles, be imaged on a magnified scale by the use of a so-called emission lens ("emission microscopy"). The lateral local resolution which is achievable by this method is, in principle, limited by the aperture error of the extraction field in accordance with the relationship:

$$d_{el} \approx \epsilon/eE_o \qquad (1)$$

wherein:
  $d_{el}$ is the minimum discernible separation between two points on the surface;
  $\epsilon$ is the most probable initial energy of the particles contributing to the formation of the image;
  e is the elemental charge;
  $E_o$ is the field strength at the surface.

Assuming a given energy distribution of the emitted particles, the resolution can, accordingly, be improved by an energy filtering operation whereby only low energy particles are permitted to take part in the formation of the image. However, this method is accompanied by a loss in intensity of the image. On the other hand, the resolution is improved if the field strength $E_o$ is made greater. In this respect the upper limit is defined by the breakdown strength in vacuum. This amounts to about 10 kV/mm.

The "classical" emission lens, also referred to in the literature as an "emission objective" or "cathode lens", is that of the Johannson type comprising a sample surface, a Wehnelt electrode and an anode. In that arrangement, in order to produce a real image of the sample surface, the field strength at that surface must be substantially smaller than the field strength between the Wehnelt electrode and the anode. The latter is, however, limited by the breakdown strength, so that in fact the field strength at the surface lies substantially below the value, which, according to Equation (1), results in poor local resolution.

In the art of image formation by means of emitting electrodes, this difficulty is overcome in the design of more modern apparatus by the use of an extraction path of maximum permissible field strength in combination with a following magnetic lens or, alternatively, an individual electrostatic lens. Because, in the design of electron emission microscopes, it is possible to use beam energies up to 50 keV, there can still be a working distance of several millimeters between the sample surface and the acceleration electrode even when there is the maximum permissible field intensity at the sample surface.

In image formation by means of emitted ions, which are then mass analysed by a magnetic sector field ("ion microanalysis"), it is possible to use beam energies of up to only about 10 keV if the size of the analyzing magnet is to be kept within reasonable dimensions for handling. Furthermore a working distance of several millimeters is necessary in order to provide the possibility of exciting the sample surface to emit secondary ions by bombardment with a laterally projected primary ion beam. Consequently, when it is desired to use as the emitting optical system, a combination of extraction path and an individual lens, the attainable field intensity at the test surface will then be substantially less than the above mentioned limit of 10 kV/mm.

SUMMARY OF THE INVENTION

An object of the present invention is, therefore, to provide an electrostatic emission lens which will permit the use of maximum field strength of about 10 kV/mm at the sample surface while still having a working distance of several millimeters between the sample surface and the first electrode.

According to the present invention the solution of the stated problem is possible by the use of an electrostatic emission lens of the above-mentioned type including the features set forth broadly in appended claim 1. Therefore, the emission lens according to the present invention includes an optical system comprising the sample surface and two aperatured diaphragms arranged, preferably, in axially symmetrical positions, of which the first diaphragm accelerates the charged particles up to an energy level which is a multiple of the required final energy, while the second diaphragm retards the particles down to the required final energy level. Preferably the particles are first accelerated up to at least double and, in particular, at least three to ten times, the required final energy. By suitable choice of the spacing distances and the potential relationships, such an arrangement can be used for projecting over a given distance a real magnified electron-optical or ion-optical image of the sample surface.

When compared with the above mentioned Johannson emission lens, which likewise comprises a sample surface and two aperatured diaphragms, but in which the first one (the Wehnelt electrode) is situated both geometrically as well as in respect of its potential, close to the sample surface, in contrast thereto, in the emission lens according to the present invention, the first electrode is given a potential which is a multiple of the anode potential, if the potential of the sample surface is defined as zero.

BRIEF DESCRIPTION OF THE DRAWINGS

The invention will become more readily apparent from the following description of preferred embodiments thereof with reference to the accompanying drawings, in which.

DESCRIPTION OF THE PREFERRED EMBODIMENTS

Figure 1:
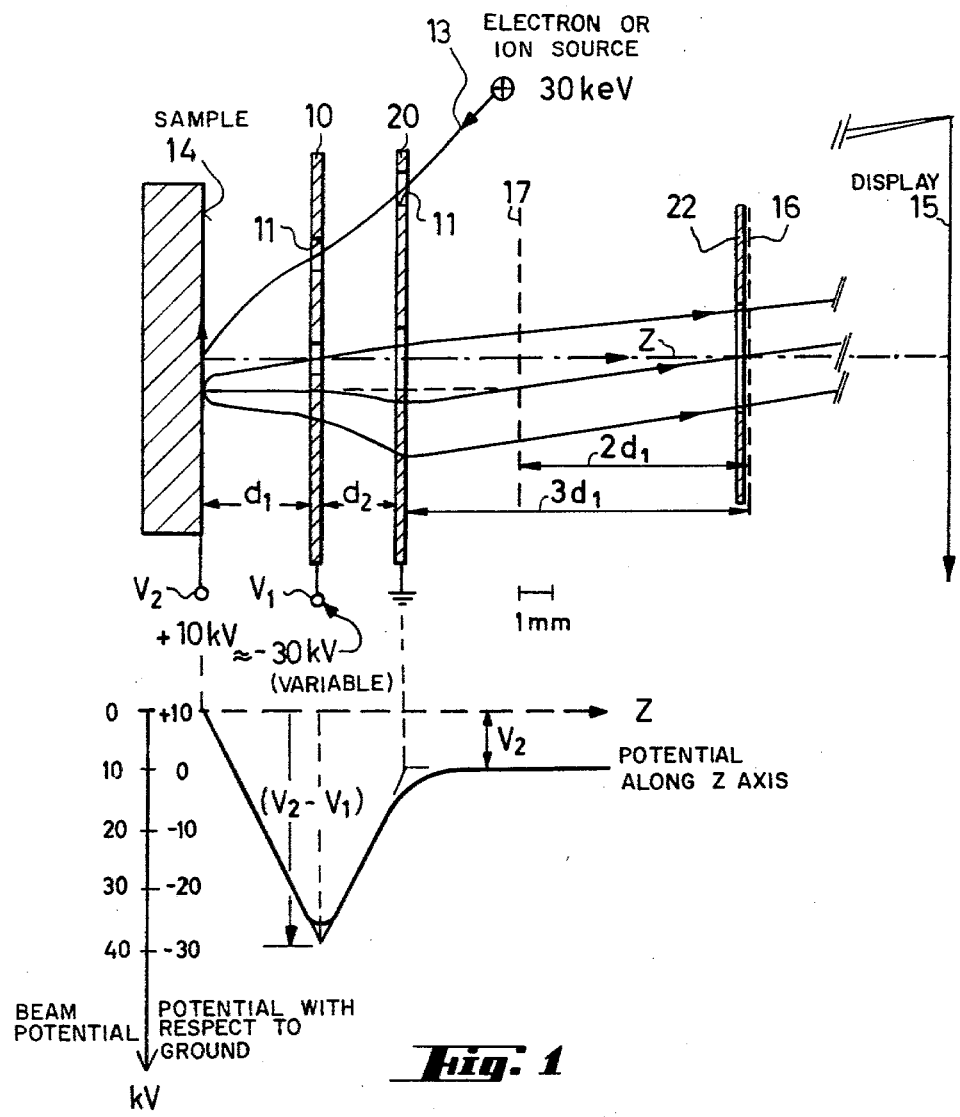
FIG. 1 illustrates schematically an axial section through an electrostatic emission lens according to a first practical embodiment of the present invention, and a corresponding diagram of the potential distribution with respect to ground, which prevails along the optical axis z.

FIG. 1 shows a practical embodiment of the present invention for ion-optical imaging of a conductive surface by means of positive secondary ions, which are released from the surface by a beam of high energy positive primary ions. The emission lens according to FIG. 1 comprises two coaxially placed and apertured diaphragm electrodes 10 and 20 arranged at a spacing distance $d_2$, the first of which electrodes is connected to a variable high voltage potential source $V_1$, while the second electrode 20 is connected to ground potential. These apertured diaphragm electrodes 10 and 20 have further apertures 11 for access by a primary ion beam 13, which strikes the sample surface 14 in the vicinity of the axis z, and which may have an energy, for example, of a few multiples of 10 keV, e.g. 30 keV. The sample surface 14, which has a spacing $d_1$ from the apertured diaphragm electrode 10, is connected to a fixed voltage source, which delivers the beam energy of the secondary ions and produces an accelerating potential $V_2$, e.g. of about +10 kV with respect to ground potential.

The spacing distances $d_1$ and $d_2$ are selected in such a manner that the field strengths between the first apertured diaphragm electrode 10 and the sample surface 14 on one hand, and between the first and the second apertured diaphragm electrode 20, on the other hand are at least approximately equal and opposite, and under the conditions shown in the diagram, each amount to 10 kV/mm. When using a potential ratio of $(V_2-V_1)/V_2=4$ and a spacing ratio of $d_1:d_2=4:3$, then an inverted real and highly magnified ion-optical image 15 of the sample surface 14 is projected over a distance, which is large when compared with the axial dimensions of the emission lens functioning as an imaging objective. These potential relationships are illustrated in FIG. 1. The adjustment of sharpness of the image is effected by means of the variable voltage at the apertured diaphragm electrode 10. In FIG. 1 the path of the beam in the radial dimension is drawn on a greatly enlarged scale. The backfocal plane 16 is located at a distance 3 $d_1$ behind the apertured diaphragm electrode 20, at this point an apertured diaphragm 22 may be arranged to improve the resolution. The focal length (distance between the principal plane 17—focal plane 16) amounts to 2 $d_1$.

The most probable energy of the secondary ions is about 5 eV. According to Equation (1), in this case and when $E_o=10$ kV/mm, a lateral resolution of 0.5 μm is obtained, even without an additional apertured diaphragm and, therefore, without reduction in the ion transmission. If energy filtering is employed, then, assuming the same ion transmission as in the previously known ion microscopes, a substantially better resolution can be achieved.

The arrangement can be used in an analogous manner for negative ions by reversing the sign of all the potentials.

Figure 2:
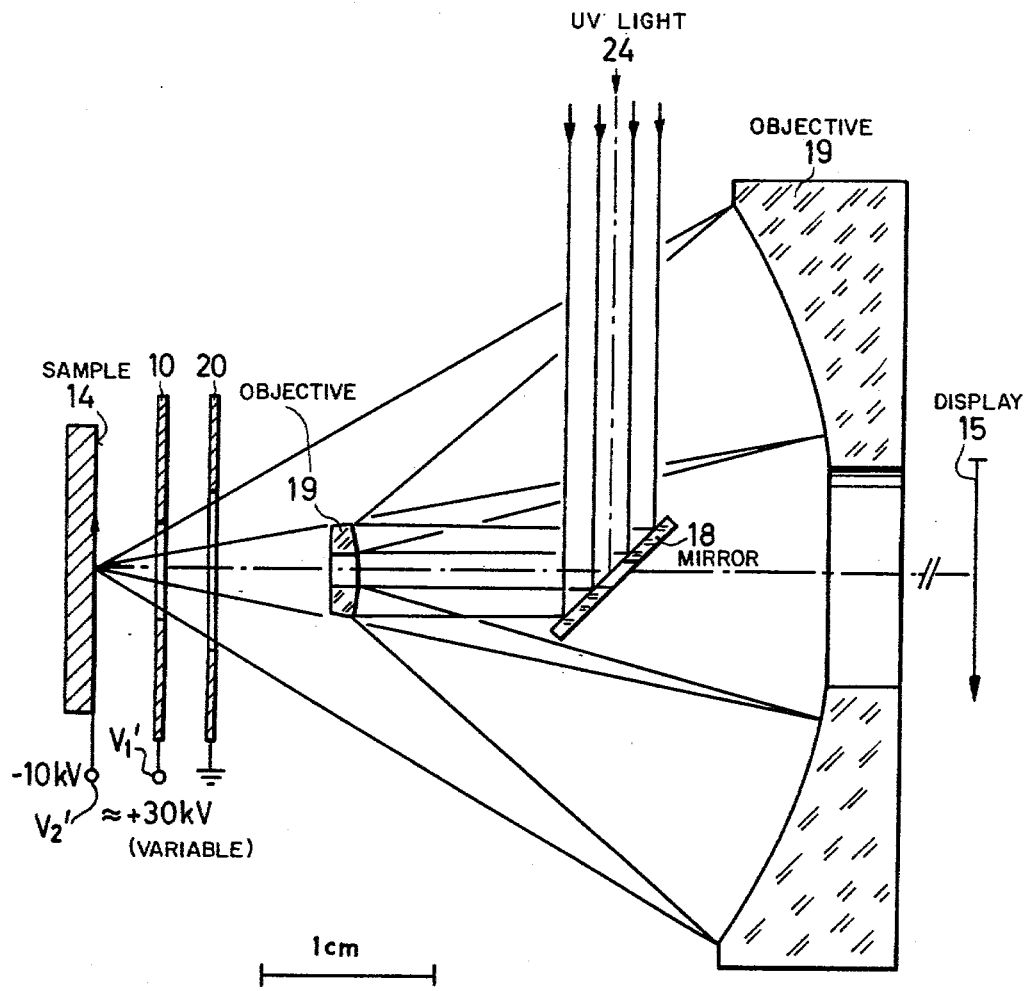
FIG. 2 illustrates schematically an axial section taken through a second practical embodiment of an electrostatic emission lens according to the present invention.

FIG. 2 shows a further practical embodiment of the present invention for the electron-optical image formation of a conducting surface by means of photoelectrons. The spacing conditions and the potential relationships between the sample surface 14 and the apertured diaphragm electrodes 10 and 20 are similar to those in FIG. 1, but the polarities of the potentials $V_1'$ and $V_2'$ are reversed in sign as compared with the potentials $V_1$ and $V_2$ in FIG. 1. Furthermore the coaxial bores of the two apertured diaphragm electrodes 10 and 20 are made sufficiently large to allow focusing of UV light 24, by means of a plane mirror 18 and a reflecting objective 19, on to the sample surface 14, at which photoelectrons are released. The reflecting objective may serve also for the microscopic observation of the sample surface 14.

The most probable energy of photoelectrons is typically 0.4 eV. According to Equation (1) under these conditions and if $E_o=10$ kV/mm, a lateral resolution of 40 (nm) nanometer is obtained without the use of an additional apertured diaphragm.

The practical embodiments of the invention according to FIG. 1 and 2 may be combined, such combination involving mainly the use of polarity reversible voltage source and, furthermore, electrodes with apertures 11 for a primary ion beam, in combination with the optical system for irradiating the sample surface 14 with a beam of optical energy of suitably short wavelength, whereby it becomes possible to use the same emission lens, and to examine a sample surface both ion-microscopically, by means of secondary ions, as well as electron-microscopically, by means of secondary electrons or photoelectrons.

The magnified image 15 may be projected on to a luminescent screen, a photoelectric receiver, e.g., a television camera tube, or fed to the input electrode of an image intensifier or any other type of receiver of micro-images.

It will be apparent from the description of the invention given above that further modifications and alternative forms may be developed without departing from the spirit of the invention. Thus, it is intended that the true scope of the invention be limited only by the following claims.

I claim:

1. An electrostatic emission lens arrangement for producing a microparticle image of a surface by means of charged particles emitted from said surface and accelerated to a predetermined final energy level, and comprising a first and a second apertured diaphragm electrode means arranged in spaced relationship with respect to each other and to said emitting surface, a voltage biasing source for producing a predetermined potential difference between said surface and the adjacently placed first apertured diaphragm electrode means, and a predetermined potential difference between said first apertured diaphragm electrode means and the second apertured diaphragm electrode means, said emitting surface (14) and the first apertured diaphragm electrode means (10) being spaced at a first distance ($d_1$) and the first and second apertured diaphragm electrode means (10, 20) being spaced at a second distance ($d_2$), and said spacing of said electrode means and the relationship between the potentials ($V_1$, $V_2$) of said surface (14) and of said first electrode means (10) being so dimensioned that the charged particles are accelerated between said surface (14) and said first apertured diaphragm electrode means (10) to a multiple of the desired final energy level, and that the particles are retarded to the desired final energy level when passing between said first (10) and second (20) apertured diaphragm electrodes means.

2. The electrostatic emission lens according to claim 1, wherein said charged particles are accelerated between said surface and said first apertured diaphragm electrode means to an energy level at least twice the desired final energy level.

3. The electrostatic emission lens arrangement according to claim 1, wherein said particles are accelerated between said surface and said first apertured diaphragm electrode means to an energy level which is threefold to tenfold of the desired final energy level.

4. The electrostatic emission lens arrangement according to claim 1, wherein the final energy level is of the order of magnitude of at least about 10 kV.

5. The electrostatic emission lens arrangement according to claim 1, wherein the field strength between said surface and said first apertured diaphragm electrode means is about 10 kV/mm.

6. The electrostatic emission lens arrangement according to claim 1, wherein said relationship of potentials ($V_1, V_2$) is represented by the ratio ($V_2-V_1$)/$V_2$ including the relationship of the potential difference ($V_1-V_2$) which is effective between said surface and the first apertured diaphragm electrode means and the potential ($V_2$) of said surface, said ratio determining the energy of the particles and is of the order of magnitude of 4 and, said spacing relationship between said first and second electrode means is represented by the ratio ($d_1:d_2$) of the spacing distance ($d_1$) of the first apertured diaphragm electrode means from said emission surface and the spacing distance ($d_2$) between said first and second apertured diaphragm electrode means, said ratio being of the order of magnitude of 4:3.

7. The electrostatic emission lens arrangement according to claim 1, wherein said potential of said first apertured diaphragm electrode means is variable.

8. The electrostatic emission lens arrangement according to claim 1, wherein a third apertured diaphragm means (22) is arranged in a focal plane (16) located downstream of the axis of the emission lens.

9. The electrostatic emission lens arrangement according to claim 1, wherein said first and second electrode means include coaxial apertures for the energy carrying particles released from said surface and additional apertures for the incident particles directed onto said surface, said coaxial apertures coinciding with the optical axis of said arrangement.

10. The electrostatic emission lens arrangement according to claim 1, in combination with a plane apertured mirror and a reflecting objective for use as a photo-electron microscope.

* * * * *